(12) United States Patent
Adams et al.

(10) Patent No.: US 6,657,399 B2
(45) Date of Patent: Dec. 2, 2003

(54) SELF-OSCILLATING CIRCUIT FOR DRIVING HIGH-SIDE AND LOW-SIDE SWITCHING DEVICES WITH VARIABLE WIDTH PULSES

(75) Inventors: Jonathan Adams, Rancho Palos Verdes, CA (US); Edgar Abdoulin, Woodland Hills, CA (US)

(73) Assignee: International Rectifier Corporation, El Segundo, CA (US)

( * ) Notice: Subject to any disclaimer, the term of this patent is extended or adjusted under 35 U.S.C. 154(b) by 69 days.

(21) Appl. No.: 10/045,498

(22) Filed: Jan. 14, 2002

(65) Prior Publication Data

US 2002/0109471 A1 Aug. 15, 2002

Related U.S. Application Data

(60) Provisional application No. 60/264,076, filed on Jan. 26, 2001.

(51) Int. Cl.[7] ................................................ H05B 41/02
(52) U.S. Cl. ..................... 315/224; 315/246; 315/360; 363/49
(58) Field of Search .......................... 315/209 R, 224, 315/225, 226, 246, 291, 307, 360, 362; 323/311; 327/31, 33, 36, 37; 363/18, 19, 49

(56) References Cited

U.S. PATENT DOCUMENTS

| | | | | |
|---|---|---|---|---|
| 4,985,818 A | | 1/1991 | Niederreiter | 363/19 |
| 5,245,253 A | * | 9/1993 | Quazi | 315/224 |
| 5,545,955 A | * | 8/1996 | Wood | 315/224 |
| 5,923,543 A | | 7/1999 | Choi | 363/21 |
| 5,925,985 A | * | 7/1999 | Zeng et al. | 315/224 |
| 6,002,213 A | * | 12/1999 | Wood | 315/307 |
| 6,211,706 B1 | * | 4/2001 | Choi et al. | 327/108 |
| 6,229,716 B1 | | 5/2001 | Preller | 363/19 |

OTHER PUBLICATIONS

International Search Report dated Apr. 18, 2002 from the International Searching Authority for corresponding PCT Appln. No. PCT/US02/01415.

\* cited by examiner

*Primary Examiner*—Don Wong
*Assistant Examiner*—Thuy Vinh Tran
(74) *Attorney, Agent, or Firm*—Ostrolenk, Faber, Gerb & Soffen, LLP

(57) ABSTRACT

A self-oscillating circuit for driving high-side and low-side switching devices, such as MOSFETs connected in a half-bridge configuration. The circuit alternately turns on the switching devices by providing alternating gate pulses varying in duration or width. The pulses are separated by dead time to prevent cross conduction. At start up, the pulses increase from a minimum duration of zero to a maximum duration, while dead time duration simultaneously decreases to its minimum duration, to provide soft start.

20 Claims, 4 Drawing Sheets

SELF-OSCILLATING CIRCUIT FOR DRIVING HIGH-SIDE AND LOW-SIDE SWITCHING DEVICES WITH VARIABLE WIDTH PULSES

This application claims the benefit and priority of U.S. Provisional Application No. 60/264,076, filed on Jan. 26, 2001, the entire disclosure of which is hereby incorporated by reference.

BACKGROUND OF THE INVENTION

1. Field of the Invention

The present invention relates to techniques for driving high-side and low-side switching devices. More specifically, the invention relates to methods and circuits that drive high-side and low-side switching devices with alternating high-side and low-side pulses of varying duration or width to provide soft start and dead time between switching.

2. Description of the Related Art

Various driver circuits with high-side and low-side outputs are commercially available. A typical half-bridge driver, for example, provides alternating high-side and low-side output pulses to the gates of high-side and low-side power transistors. Examples include the IR2152 and IR2153 self-oscillating half-bridge driver integrated circuit (IC) products sold by International Rectifier Corporation, some features of which are described in U.S. Pat. No. 5,545,955, the disclosure of which is incorporated herein by reference in its entirety.

In the IR2152 and IR2153 products, the driver is packaged in a conventional DIP or SOIC package. The package contains internal level shifting circuitry, under voltage lockout circuitry, dead time delay circuitry, and additional logic circuitry and inputs so that the driver can self-oscillate at a frequency determined by external resistors and capacitors. These and other driver circuits provide dead time between high and low output pulses to prevent cross conduction, which occurs if both transistors conduct at the same time.

U.S. Pat. No. 6,002,213 discloses a MOS gate driver (MGD) circuit with high and low side dead time delay circuits that provide time delay intervals. The MGD circuit also includes a dead band control circuit that receives a feedback signal from a load circuit and, in response, controls the duration of the time delay interval.

In some applications, it is important to modify driver output pulses at start up. The IR2157 and IR21571 products sold by International Rectifier Corporation provide fully integrated ballast control ICs for fluorescent lamps. The IR2157 and IR21571 products include drivers and feature a start-up procedure that insures a flash-free start without an initial high voltage pulse across the lamp as well as various other features relating to lamp operation. Similarly, U.S. Pat. No. 5,932,974 discloses a lamp ballast circuit with MOS-gated power transistors connected in a half bridge to drive a gas discharge lamp. A self-oscillating driver circuit drives the transistors, and a soft-starting circuit gradually increases voltage across the lamp prior to ignition. The circuit also provides built-in dead time.

It would be advantageous to provide a gate driver circuit with improved soft start and dead time techniques.

SUMMARY OF THE INVENTION

The present invention provides a circuit for driving alternately driving high-side and low-side switching devices of, for example, a half-bridge, a full-bridge, or a push-pull primary. The circuit of the present invention produces drive pulses of varying durations (also referred to herein as pulse "widths") to control operation of the switching devices, in particular relating to the implementation of soft start and dead time.

The high-side and a low-side pulses produced by the circuit of the present invention are of approximately equal duration, thus providing balance. The high-side and low-side pulses are preferably separated by dead time.

To provide soft start, the pulses have a duration or pulse width which increases from zero to a maximum. The pulses are separated by dead time, which can decrease as the pulses increase to the maximum duration. The dead time has a minimum duration when the pulses have a maximum duration. As a result, soft start can be provided without complex circuitry for modifying voltage or oscillator frequency.

The pulse circuitry is preferably implemented with an oscillator that provides a sawtooth-like signal; each period of the oscillator signal includes a rising portion followed by a falling edge to a low portion. The pulse circuitry includes reference circuitry that provides a varying reference signal. The pulse circuitry also includes a comparator that responds to the periodic signal and to the varying reference signal by providing a pulse output signal whose pulse width is proportional to the reference signal and which terminates at the falling edge of the oscillator signal.

In this implementation, the oscillator also provides a gate pulse after the falling edge of alternate periods of the oscillator signal, so that the period of the gate pulses is half that of the first oscillator signal. The reference circuitry includes circuitry providing a rising signal that increases from start up to a maximum value. The reference circuitry can also include sampling circuitry that responds to each gate pulse by sampling the value of the rising signal; the reference circuitry can obtain the varying reference signal from each sampled value until the next gate pulse. As a result, two pulses provided between consecutive gate pulses, one each for the high-side and low-side switching devices, are approximately equal in duration.

The present invention is preferably provided in the form of an integrated circuit for driving high-side and low-side switching devices. The integrated circuit includes high-side and low-side output pins for connecting respectively to the gates of the high-side and low-side switching devices. The integrated circuit also includes pulse circuitry that provides pulses alternately through the high-side output pin to turn on the high-side switching device and through the low-side output pin to turn on the low-side switching device. The pulses vary in duration to set dead time and soft start.

The pulse circuitry includes oscillator circuitry, reference circuitry, and a comparator as described above. Further, the oscillator circuitry includes oscillator resistance and capacitance pins for connecting to an external resistance and an external capacitance to determine the frequency of the periodic signal. The reference circuitry includes increasing circuitry and sampling circuitry as described above, and the increasing circuitry includes a reference voltage pin for connecting to an external capacitance that increases in voltage as the capacitor initially charges. In this way, the reference voltage pin provides the rising signal.

Other features and advantages of the present invention will become apparent from the following description of the invention which refers to the accompanying drawings.

DETAILED DESCRIPTION OF EMBODIMENTS OF THE INVENTION

Figure 1:
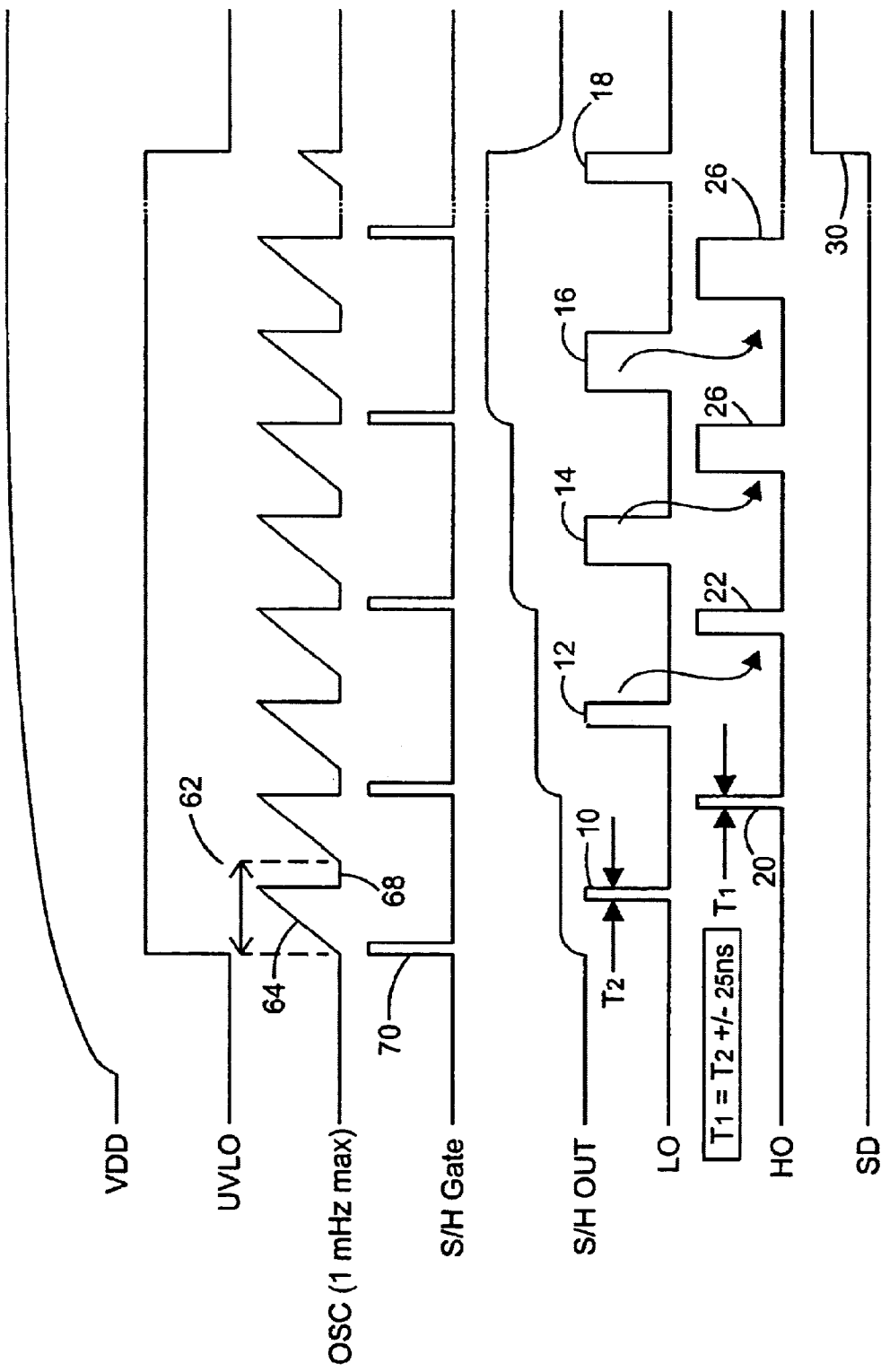
FIG. 1 is a timing diagram with waveforms that illustrate alternating high-side and low-side pulses with varying durations and other related waveforms.

FIG. 1 shows a timing diagram illustrating alternating high-side and low-side pulses that implement the new techniques described above. The waveforms labeled "HO" and "LO" at left are gate drive signals for high-side and low-side switching devices, respectively. The switching devices could, for example, be power MOSFET switching devices such as insulated gate bipolar transistors (IGBTs), connected in a half-bridge, a full-bridge, or a push-pull primary.

As shown, HO and LO include alternating pulses, with pulses 10, 12, 14, 16, and 18 in LO alternating with pulses 20, 22, 24, and 26 in HO. The pulses vary in duration to set dead time and soft start, as discussed in further detail below. In the specific example in FIG. 1, low-side and high-side pulses begin at startup, prior to pulse 12, with zero duration, and increase in duration through pulses 16 and 26, each of which has maximum pulse duration; the resulting sequence of pulses provides soft start. Pulse 18 is shortened by rising edge 30 in the waveform labeled "SD" at left, indicating that a shutdown signal has been received so that no further gate drive pulses should be provided.

Prior to shutdown, the HO and LO signals include pairs of consecutive pulses that are of approximately equal duration. In each pair, the low-side pulse, e.g. one of pulses 10, 12, 14, and 16, precedes the high-side pulse, e.g. one of pulses 20, 22, 24, and 26. As shown for pulses 10 and 20, for example, T1=T2+/−25 nsec, where T1 is the duration of pulse 20 and T2 is the duration of pulse 10. If each channel's period, e.g. from the beginning of pulse 10 to the beginning of pulse 12 on the low side, is 2000 nsec (500 KHz), this difference is no greater than 1.25% of one period.

Within and between pairs, consecutive HO and LO pulses are separated by dead time to help prevent cross conduction through the switching devices. In order to produce the soft start sequence of pulses, dead time duration decreases from a maximum dead time duration to a minimum dead time duration. In the illustrated example, a minimum dead time of 120 nsecs is obtained at a 50% pulse duty cycle.

The HO and LO waveforms in FIG. 1 illustrate how pulse duration is varied to increase from zero to maximum pulse duration while dead time is decreasing from maximum to minimum dead time duration, thus providing soft start. Additional features of waveforms in FIG. 1 are described below.

Figure 2:
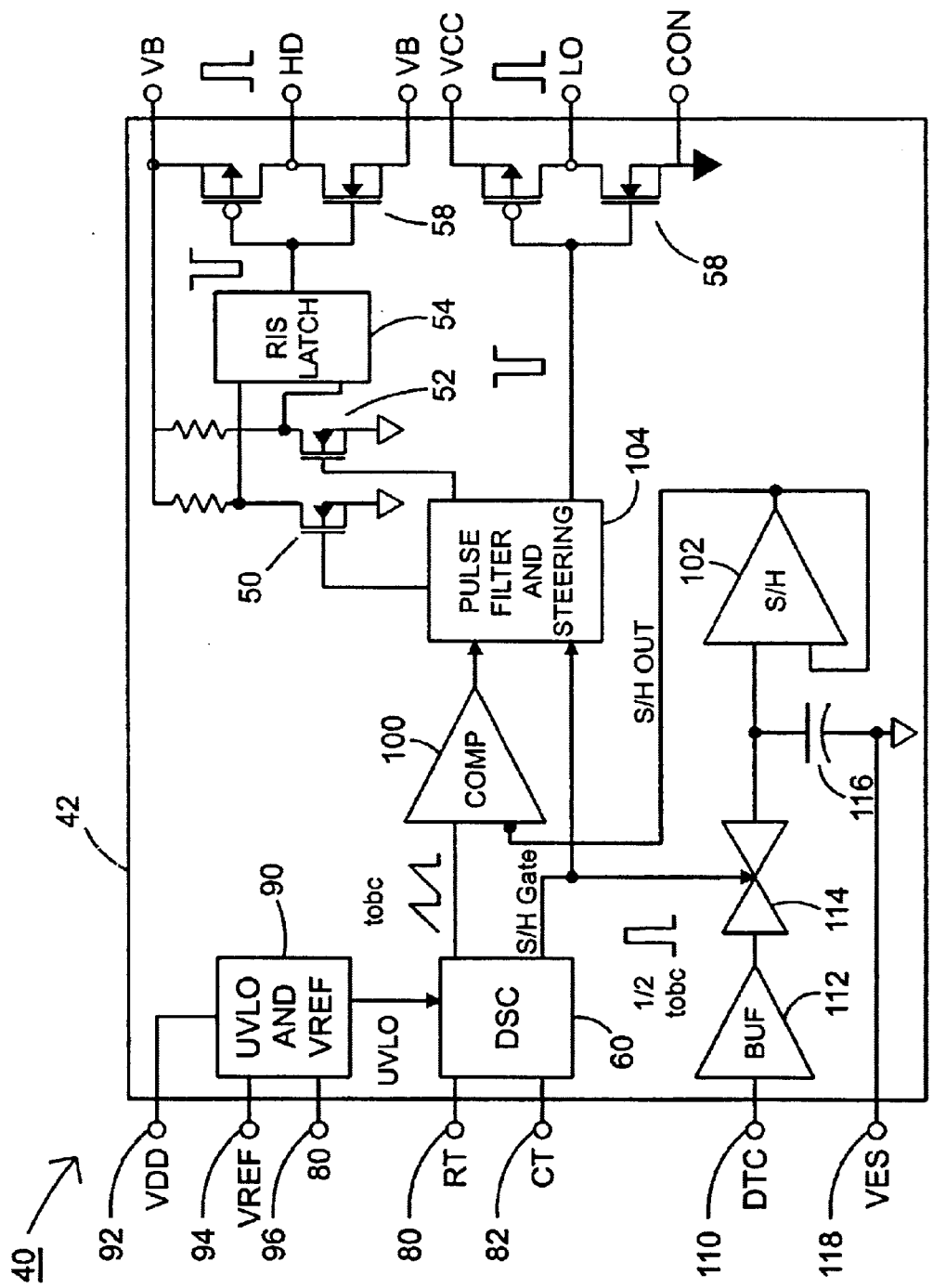
FIG. 2 is a circuit diagram showing pins and internal components of an IC that provides the waveforms in FIG. 1.

Circuit 40 in FIG. 2 illustrates pins and internal components of IC 42, in which the circuit of the present invention can be implemented. IC 42 is illustratively a product of assignee, International Rectifier Corporation, identified as the IR2191. The IR2191 can serve as a high speed, high voltage self oscillating half-bridge driver. Among its features are a floating channel designed for bootstrap operation up to +200 Vdc; pairs of one high side and one low side pulse with widths per cycle for balanced operation that match to +/−25 nsec; external asynchronous shut down; and application in fixed dead time or pulse width modulated DC—DC converters with half-bridge or full-bridge topologies up to 200 Vdc bus voltage or with push-pull primary topologies without restrictions on buss voltage.

Some of the pins and external connections of IC 42 can be understood from their counterparts in the IR2152 product, disclosed in the published data sheet for the IR2152 and in U.S. Pat. No. 5,545,955, incorporated by reference herein in its entirety. The '955 patent also discloses components that have counterparts in HO and LO output circuitry in IC 42, including level shifting circuitry with transistors 50 and 52, R/S latch 54, and high-side and low-side drivers 56 and 58 connected to the high-side gate driver floating supply (VB) pin, the high-side output (HO) pin, the high voltage floating supply return (VS) pin, the low-side supply (VCC) pin, the low-side output (LO) pin, and the low-side drivers return (COM) pin.

In addition to the HO and LO output circuitry, however, IC 42 includes several other components that, together with the HO and LO output circuitry, function as pulse circuitry, providing pulses to alternately turn on high-side and low-side switching devices. As noted above, the pulses vary in duration. FIG. 2 illustrates one of many ways in which pulse circuitry may be implemented.

Oscillator 60 and associated circuitry function as oscillator circuitry, providing first and second periodic signals. The first periodic signal, a sawtooth like signal, labeled "OSC" in FIG. 1, has frequency fosc. As illustrated in FIG. 1 for period 62 of the OSC signal, each period includes rising portion 64 followed by a falling edge 66 to low portion 68 that provides the minimum dead time duration. The second periodic signal, labeled "S/H Gate" in FIG. 1, has frequency fosc/2 and comprises a pulse train, as shown. Each period of the S/H gate signal includes a single pulse, such as pulse 70 in FIG. 1.

The oscillator circuitry in FIG. 2 also includes RT pin 80 and CT pin 82, which can be connected respectively to an external resistance and to an external capacitance to set fosc, as discussed below. In addition, oscillator 60 also receives signals from UVLO/VREF component 90.

UVLO/VREF 90, which can be implemented similarly to conventional undervoltage circuitry, receives supply voltage VDD from logic supply (VDD) pin 92, as illustrated by the waveform labeled "VDD" in FIG. 1. When VDD reaches a minimum operating voltage, UVLO/VREF 90 provides a high enable signal to oscillator 60, labeled "UVLO" in FIG. 1. UVLO/NVREF 90 also provides an appropriate voltage on reference voltage (VREF) pin 94, as discussed below. Finally, UVLO/VREF 90 receives through shut down (SD) pin 96, as illustrated by the SD waveform in FIG. 1 and, when SD pin 96 goes high, UVLO/VREF provides a low enable, or disable, signal to oscillator 60, preventing it from providing further OSC and S/H gate signals.

Oscillator 60 may be implemented to provide the OSC and S/H Gate signals in many different ways. In one implementation, a sawtooth oscillator can be use to produce the sawtooth like periodic signal shown. A single shot circuit can be used to provide the S/H gate signal.

Comparator 100 functions as comparison circuitry, receiving the OSC signal and also the S/H OUT signal from S/H buffer 102. In response, comparator 100 provides a pulse output signal whose pulse width is proportional to the level of the variable reference signal and which pulse output signal has pulses that terminate at the falling edge 66 in the OSC signal.

The pulse output signal from comparator 100 is received by pulse filter and steering circuitry 104, which can be implemented similarly to conventional circuitry or in any other appropriate way for filtering pulses and steering alternate pulses to the HO and LO output circuitry described above. Pulse filter and steering circuitry 104 also receives the S/H Gate signal, which provides timing information to pulse filter and steering circuitry 104.

S/H buffer 102 functions as part of reference circuitry, providing the S/H OUT signal to obtain a varying reference voltage whose level ultimately determines LO and HO pulse duration. As shown in FIG. 1, at start up, when S/H OUT is low, LO and HO pulse duration is zero. Then, at higher levels of S/H OUT, LO and HO pulse duration increases, until S/H OUT reaches a level at which LO and HO pulse duration is maximum.

Pulse width control (DTC) pin 110, buffer 112, S/H gate 114, capacitance 116, and logic ground (VSS) pin 118 also function as parts of the reference circuitry, which could also be implemented in many other ways. In response to signals from external components described below, DTC pin 110 and buffer 112 provide a rising signal that increases from zero at start up to a maximum value such as 5V. This rising signal is provided by a capacitor CDT that charges to a voltage determined by a voltage divider comprising resistors R1 and R2.

S/H gate 114 responds to an S/H Gate pulse by briefly providing a conductive path so that the rising signal from buffer 112 can reach S/H buffer 102 and capacitance 116. Capacitance 116 stores the gated value of the rising signal from buffer 112 while S/H buffer 102 provides it as input to comparator 100. S/H gate 114, capacitance 116, and S/H buffer 102 therefore function as sampling and holding circuitry, responding to each S/H Gate pulse by sampling and holding the level from buffer 112. Each time the level in buffer 112 is sampled, capacitor 116 charges, increasing the voltage sampled by S/H buffer 102. The sampled and held value is provided as the reference signal until the next S/H Gate pulse.

Since one S/H Gate pulse is received for every two cycles of the OSC signal, the varying reference signal is approximately constant between consecutive S/H Gate pulses. Therefore, a pair of HO and LO output pulses provided between S/H Gate pulses are substantially equal in width.

Additional circuitry (not shown) responds to a disable signal from UVLO/VREF 90 by permitting capacitance 116 to discharge, so that S/H OUT goes low when SD goes high, as shown in FIG. 1.

Figure 3:
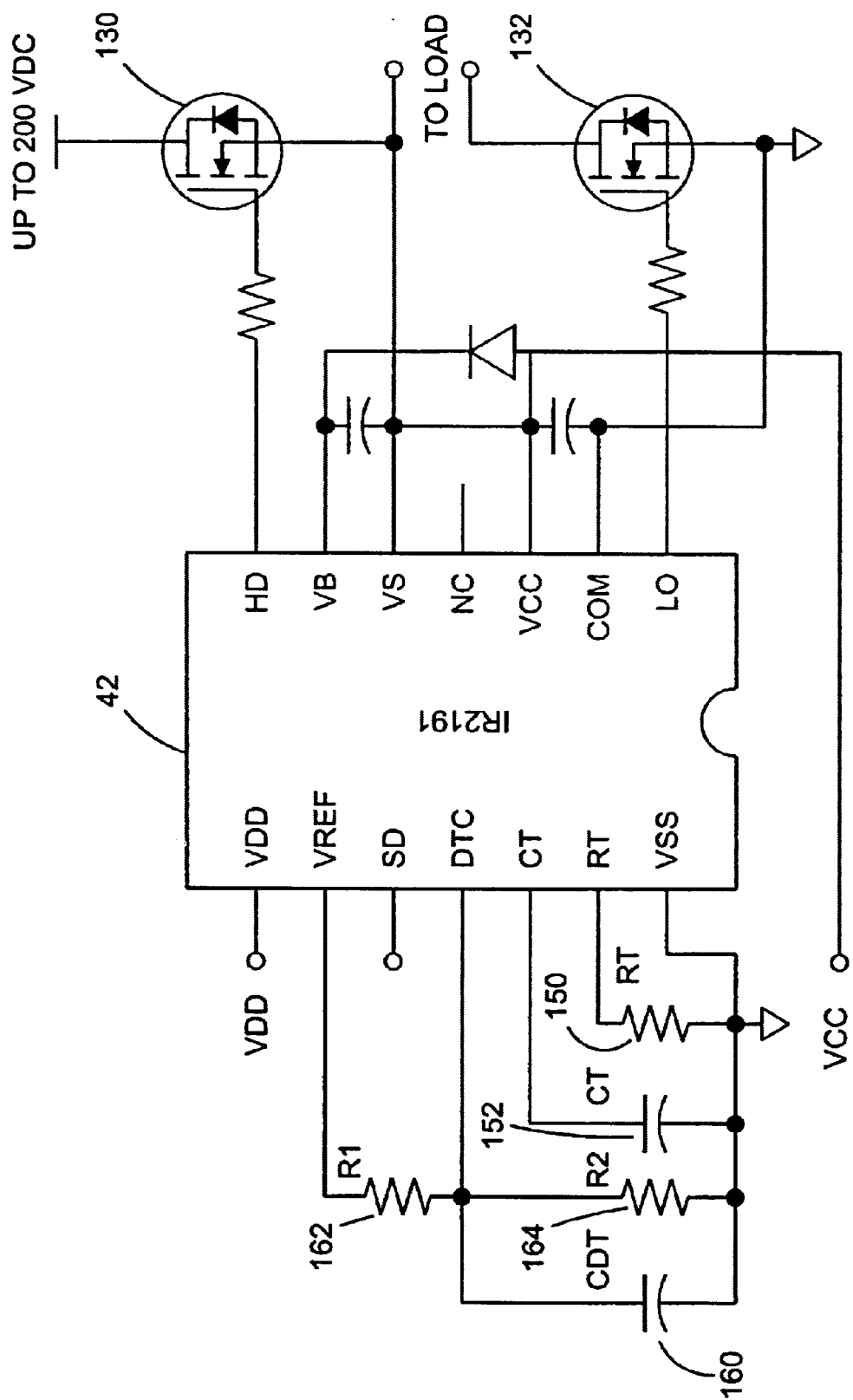
FIG. 3 is a circuit diagram showing a circuit in which the IC of FIG. 2 is connected to drive high-side and low-side switching devices connected in a half-bridge or full-bridge topology.
Figure 4:
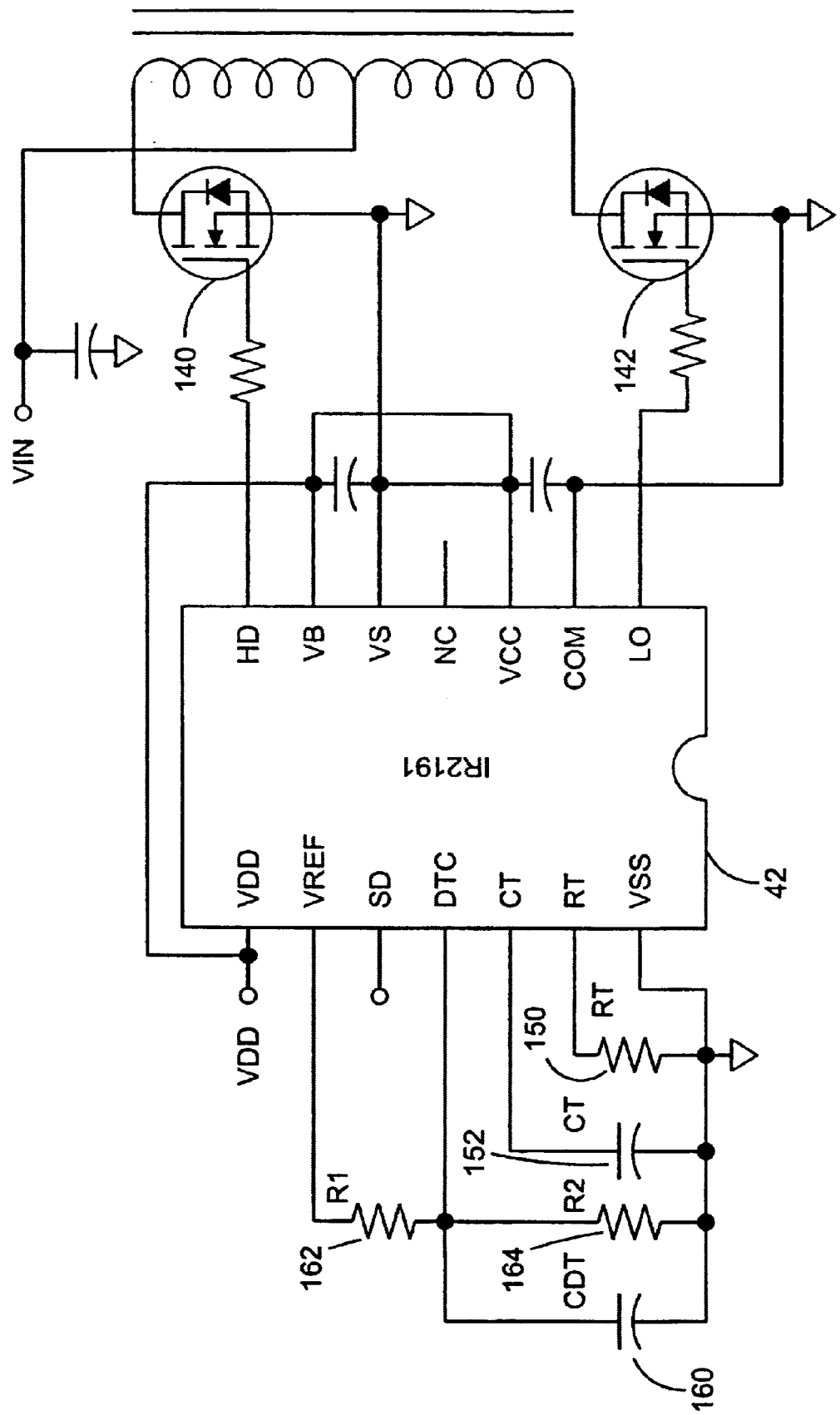
FIG. 4 is a circuit diagram showing a circuit in which the IC of FIG. 2 is connected to drive high-side and low-side switching devices connected in a push-pull primary topology.

In FIG. 3, the HO and LO signals from IC 42 are provided to MOSFET switching devices 130 and 132, respectively, connected in a half-bridge or full-bridge topology. In FIG. 4, the HO and LO signals from IC 42 are similarly provided to MOSFET switching devices 140 and 142, respectively, connected in a push-pull primary topology.

In both FIGS. 3 and 4, RT pin 80, CT pin 82, VREF pin 94, DTC pin 110, and VSS pin are connected to external components that control operating parameters of IC 42. For example, resistance (RT) 150 and capacitance (CT) 152, connected respectively between RT pin 80 and CT pin 82 on the one hand and VSS pin 118 on the other, determine fosc, the frequency of the OSC signal, according to the following:

$$fosc=1/(RT.CT+DTMIN),$$

where DTMIN is the minimum dead time, such as 120 nsec, determined by components of oscillator 60.

Dead time capacitance (CDT) 160 connected between DTC pin 110 and VSS pin 118, series resistance (R1) 162 connected between VREF pin 94 and DTC pin 110, and shunt resistance (R2) 164 connected across CDT 160 play a similar role, determining voltage Vdtc on DTC pin 110. Since oscillator 60 produces rising portion 64 with uniform slope, Vref, Vdtc, RT 150, and CT 152 determine pulse width (PW) on both the high and low sides according to the following:

$$PW=RT.CT.Vdtc/Vref.$$

If CVDT 160, R1 162, and R2 164 are chosen appropriately, Vdtc rises slowly enough that several S/H Gate pulses occur before it reaches its maximum value, determined by Vref and the ratio of series resistance 162 and shunt resistance 164. In this case, soft start occurs as described above. CVDT 160 controls duration of the pulses from zero at start up to the maximum pulse duration PWmax. For example, with Vdtc=Vref:

$$PWmax-1/fosc-DTMIN$$

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A method of driving high-side and low-side switching devices: the method comprising providing pulses to alternately turn on the high-side and low-side switching devices: the pulses increasing from a minimum duration to a maximum duration to provide soft start further wherein each pulse is separated by a dead time from a following pulse; the duration of the dead time decreasing as the duration of the pulses increases to the maximum duration; the dead time having a minimum duration when the pulses have the maximum duration.

2. The method of claim 1 in which the pulses include a first high-side pulse to turn on the high-side switching device and a first low-side pulse to turn on the low-side switching device; the first high-side pulse and the first low-side pulse being consecutive and of approximately equal pulse duration.

3. The method of claim 1 in which each pair of consecutive pulses comprises a high-side pulse and a low-side pulse.

4. A circuit for driving high-side and low-side switching devices; the circuit comprising:

pulse circuitry that provides pulses to alternately turn on the high-side and low-side switching devices; the pulses increasing from a minimum duration to a maximum duration to provide soft start, further wherein the pulse circuitry provides each pulse so that it is separated by a dead time from a following pulse; the duration of the dead time decreasing as the duration of the pulses increases to the maximum duration; the dead time having a minimum duration when the pulses have the maximum duration.

5. A circuit for driving high-side and low-side switching devices; the circuit comprising:

pulse circuitry that provides pulses to alternately turn on the high-side and low-side switching devices; the pulses increasing from a minimum duration to a maximum duration to provide soft start and further wherein the pulse circuitry includes:

oscillator circuitry that provides a periodic signal, each period of which includes a rising portion followed by a falling edge to a low portion;

reference circuitry that provides a varying reference signal; and comparison circuitry that responds to the periodic signal and the varying reference signal by providing a pulse output signal whose pulse width is proportional to the reference signal.

6. The circuit of claim 5, wherein each pulse of the pulse output signal terminates at the falling edge of the periodic signal.

7. The circuit of claim 5 in which the oscillator circuitry further provides a gate pulse during the low portion of alternate periods of the periodic signal; the reference circuitry including:

increasing circuitry that provides a rising signal that increases from start up to a maximum value; and sampling circuitry that responds to each gate pulse by sampling the rising signal's value; the reference circuitry obtaining the varying reference signal from each sampled value until the next gate pulse.

8. The circuit of claim 7 in which the pulse circuitry provides a high-side pulse to turn on the high-side switching device and a low-side pulse to turn on the low-side switching device between consecutive gate pulses; the high-side pulse and the low-side pulse being approximately equal in duration.

9. The circuit of claim 5 in which the high-side and low-side switching devices are connected in a half-bridge.

10. An integrated circuit for driving high-side and low-side switching devices; the integrated circuit comprising:

a high-side output pin for connecting to the high-side switching device's gate;

a low-side output pin for connecting to the low-side switching device's gate;

pulse circuitry that provides pulses alternately through the high-side output pin to turn on the high-side switching device and through the low-side output pin to turn on the low-side switching device; the pulses varying in duration from a minimum duration to a maximum duration to provide soft start in which the pulse circuitry includes:

oscillator circuitry that provides a periodic signal, each period of which includes a rising portion followed by a falling edge to a low portion;

reference circuitry that provides a varying reference signal; and comparison circuitry that responds to the periodic signal and the varying reference signal by providing a pulse output signal whose pulse width is proportional to the reference signal.

11. The integrated circuit of claim 10 wherein each pulse of the pulse output signal terminates at the falling edge of the periodic signal.

12. The integrated circuit of claim 10 in which the oscillator circuitry includes an oscillator resistance pin for connecting to an external resistance and an oscillator capacitance pin for connecting to an external capacitance; the external resistance and external capacitance determining the periodic signal's frequency.

13. The integrated circuit of claim 10 in which the oscillator circuitry further provides a gate pulse during the low portion of alternate periods of the periodic signal; the reference circuitry including:

increasing circuitry that provides a rising signal that increases from start up to a maximum value; and sampling circuitry that responds to each gate pulse by sampling the rising signal's value; the reference circuitry obtaining the varying reference signal from each sampled value until the next gate pulse.

14. The integrated circuit of claim 13 in which the pulse circuitry provides a high-side pulse to turn on the high-side switching device and a low-side pulse to turn on the low-side switching device between consecutive gate pulses; the high-side pulse and the low-side pulse being approximately equal in duration.

15. The integrated circuit of claim 13 in which the increasing circuitry includes a reference voltage pin for connecting to an external capacitance, the voltage stored by the external capacitance increasing so that the reference voltage pin provides the rising signal.

16. An integrated circuit for driving high-side and low-side switching devices; the integrated circuit comprising:

a high-side output pin for connecting to the high-side switching device's gate;

a low-side output pin for connecting to the low-side switching device's gate;

pulse circuitry that provides pulses alternately through the high-side output pin to turn on the high-side switching device and through the low-side output pin to turn on the low-side switching device; the pulse circuitry including:

oscillator circuitry that provides first and second periodic signals, each period of the first periodic signal including a rising portion followed by a falling edge to a low portion; each period of the second periodic signal including two consecutive periods of the first periodic signal and including a gate pulse during the low portion of the first of the consecutive periods;

reference circuitry that provides a varying reference signal; the reference circuitry including:

increasing circuitry that provides a rising signal with a value that increases from start up to a maximum value; and sampling circuitry that responds to each gate pulse by sampling the rising signal's value; the reference circuitry obtaining the varying reference signal from each sampled value until the next gate pulse; the varying reference signal being approximately constant between consecutive gate pulses; and comparison circuitry that responds to the first periodic signal and the varying reference signal by providing a pulse output signal whose pulse width is proportional to the reference signal and whose pulses terminate at the falling edge of the first periodic signal; the comparison circuitry providing first and second pulse output signals between consecutive gate pulses; the pulse circuitry providing a pulse in response to each pulse output signal; the pulses provided in response to the first and second pulse output signals including a high-side pulse to turn on the high-side switching device and a low-side pulse to turn on the low-side switching device; the high-side pulse and the low-side pulse being approximately equal in duration because the varying reference signal is approximately constant between consecutive gate pulses.

17. An integrated circuit for driving high-side and low-side switching devices; the integrated circuit comprising:

a high-side output pin for connecting to the high-side switching device's gate;

a low-side output pin for connecting to the low-side switching device's gate;

pulse circuitry that provides pulses alternately through the high-side output pin to turn on the high-side switching device and through the low-side output pin to turn on the low-side switching device; the pulse circuitry including:
- oscillator circuitry that provides a periodic oscillator signal, each period of the oscillator signal including a rising portion followed by a falling edge to a low portion;
- reference circuitry that provides a varying reference signal; and
- comparison circuitry that responds to the oscillator signal and the varying reference signal by providing a pulse output signal whose pulse width is proportional to the reference signal; the pulse circuitry providing a pulse in response to each pulse output signal; the pulses increasing from a minimum pulse duration at startup to a maximum pulse duration, providing soft start.

18. The integrated circuit of claim 17, wherein each pulse of the pulse output signal terminates at the falling edge of the periodic signal.

19. An integrated circuit for driving high-side and low-side switching devices; the integrated circuit comprising:
- a high-side output pin for connecting to the high-side switching device's gate;
- a low-side output pin for connecting to the low-side switching device's gate;
- pulse circuitry that provides pulses alternately through the high-side output pin to turn on the high-side switching device and through the low-side output pin to turn on the low-side switching device; the pulse circuitry including:
  - oscillator circuitry that provides a periodic oscillator signal, each period of the oscillator signal including a rising portion followed by a falling edge to a low portion equal in length to a minimum dead time duration;
  - reference circuitry that provides a varying reference signal; and
  - comparison circuitry that responds to the oscillator signal and the reference signal by providing a pulse output signal whose pulse width is proportional to the reference signal; the pulse circuitry providing a pulse in response to each pulse output signal, each pulse being separated from a following pulse by a dead time; the pulses increasing from a minimum pulse duration at startup to a maximum pulse duration, providing soft start the dead time between the pulses decreasing from a maximum dead time duration at startup to the minimum dead time duration.

20. The integrated circuit of claim 19, wherein each pulse of the pulse output signal terminates at the falling edge of the oscillator signal.

* * * * *